(12) United States Patent
Wang

(10) Patent No.: US 9,640,589 B2
(45) Date of Patent: May 2, 2017

(54) ORGANIC ELECTROLUMINESCENT DISPLAY PANEL AND DISPLAY DEVICE

(71) Applicant: BOE TECHNOLOGY GROUP CO., LTD., Beijing (CN)

(72) Inventor: Huifeng Wang, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 100 days.

(21) Appl. No.: 14/429,119

(22) PCT Filed: Jul. 21, 2014

(86) PCT No.: PCT/CN2014/082613
§ 371 (c)(1),
(2) Date: Mar. 18, 2015

(87) PCT Pub. No.: WO2015/113382
PCT Pub. Date: Aug. 6, 2015

(65) Prior Publication Data
US 2016/0284766 A1    Sep. 29, 2016

(30) Foreign Application Priority Data

Jan. 29, 2014    (CN) .......................... 2014 1 0043888

(51) Int. Cl.
*H01L 27/32* (2006.01)
(52) U.S. Cl.
CPC ...... *H01L 27/3211* (2013.01); *H01L 27/3218* (2013.01); *H01L 27/3246* (2013.01); *H01L 27/3276* (2013.01); *H01L 2227/323* (2013.01)
(58) Field of Classification Search
None
See application file for complete search history.

(56) References Cited

U.S. PATENT DOCUMENTS

2004/0246426 A1    12/2004  Wang et al.
2007/0024183 A1*    2/2007  Lih .......................... H01L 51/56
                                                        313/504

(Continued)

FOREIGN PATENT DOCUMENTS

CN         1725274 A      1/2006
CN       102354701 A      2/2012

(Continued)

OTHER PUBLICATIONS

2nd Office Action issued in corresponding Chinese application No. 201410043888.7 dated May 4, 2016.

(Continued)

*Primary Examiner* — Ashok Patel
(74) *Attorney, Agent, or Firm* — Nath Goldberg & Meyer; Joshua B. Goldberg; Scott H. Blackman

(57) ABSTRACT

The invention provides an organic electroluminescent display panel and a display device. The organic electroluminescent display panel of the invention includes a substrate, and a plurality of sub-pixel units of the same shape formed on the substrate, each sub-pixel unit including 6 sub-pixel elements of the same color, the geometric shape of each sub-pixel element being such that the center of the sub-pixel unit where it is located is taken as a vertex; the sub-pixel units are in 3 colors, any two adjacent sub-pixel units being different in color; the connecting lines of the centers of every two adjacent sub-pixel units among 3 sub-pixel units adjacent to each other form an equilateral triangle, 3 sub-pixel elements defined by that equilateral triangle form one pixel unit.

20 Claims, 2 Drawing Sheets

(56) References Cited

U.S. PATENT DOCUMENTS

| | | | | |
|---|---|---|---|---|
| 2007/0223219 A1* | 9/2007 | Medendorp | .......... | C09K 11/586 |
| | | | | 362/231 |
| 2007/0236134 A1* | 10/2007 | Ho | .................. | H01L 27/3213 |
| | | | | 313/500 |
| 2013/0038513 A1 | 2/2013 | Park et al. | | |
| 2015/0014662 A1* | 1/2015 | Huang | ................ | H01L 27/3218 |
| | | | | 257/40 |
| 2016/0043150 A1* | 2/2016 | Wang | ................. | H01L 27/3211 |
| | | | | 257/40 |

FOREIGN PATENT DOCUMENTS

| | | |
|---|---|---|
| CN | 202183373 U | 4/2012 |
| CN | 102830455 A | 12/2012 |
| CN | 102855820 A | 1/2013 |
| CN | 103000636 A | 3/2013 |
| CN | 103811533 A | 5/2014 |
| TW | 200706061 A | 2/2007 |
| TW | 201225269 A | 6/2012 |

OTHER PUBLICATIONS

Office Action dated Dec. 2, 2015 issued in corresponding Chinese Application No. 201410043888.7.
English translation of the Written Opinion of the International Searching Authority filed on Mar. 18, 2015.
International Search Report for PCT/CN2014/082613.

* cited by examiner

ORGANIC ELECTROLUMINESCENT DISPLAY PANEL AND DISPLAY DEVICE

This is a National Phase Application filed under 35 U.S.C. 371 as a national stage of PCT/CN2014/082613, filed Jul. 21, 2014, an application claiming the benefit to Chinese Application No. 201410043888.7, filed Jan. 29, 2014; the content of each of which is hereby incorporated by reference in its entirety.

FIELD OF THE INVENTION

The present invention relates to the field of display technology, and particularly relates to an organic electroluminescent display panel and a display device.

BACKGROUND OF THE INVENTION

The organic electroluminescent device (OLED), in comparison with other flat panel display technology, has such advantages as self luminescence, high luminance, wide visual angle, high resolution, low energy consumption, lightness and thinness and the like, thus being widely used.

A traditional organic electroluminescent element is of a multi-layered structure, its principle being that an organic electroluminescent material layer is provided between the anode layer and the cathode layer to produce electroluminescence. The organic electroluminescent element can be divided into two classes according to the material used thereby: one is the light-emitting diode of small molecules mainly using dye and pigment material, known as OLED (Organic Light-Emitting Diode) or OEL (Organic Electroluminescence), and the other is the light-emitting diode mainly using polymer material, known as PLED (Polymer Light-Emitting Diode) or LEP (Light-Emitting Polymer). According to the color of the light emitted by an organic electroluminescent element, the material of the organic electroluminescent material layer mainly consists of three kinds of electroluminescent material which are in red (R), in blue (G) and in blue (B). For the purpose of full-color display, each pixel unit in an organic electroluminescent display panel includes three sub-pixel units R, G, and B, and the organic electroluminescent element emitting light in one color corresponds to one sub-pixel unit.

There are mainly two kinds of thin film deposition method for the organic electroluminescent display device: vacuum evaporation and solution process. The vacuum evaporation is suitable for organic small molecule material, good in film-forming uniformity, comparatively mature in technology, but large in equipment investment, low in material utilization ratio, low in Mask alignment accuracy for large size products. The solution process includes spin coating, ink jet printing, nozzle painting and the like, suitable for polymer material and soluble small molecule material, and characterized by being low in equipment cost, highly advantageous in large scale production and large size product.

For evaporation process, although medium and small size organic electroluminescent display devices have been mass-produced, resolution thereof is still much lower than that of LCDs, whereas it is difficult to mass-produce the large size organic electroluminescent display devices due to low Mask alignment accuracy in the process of manufacturing the sub-pixel units; for solution process, although the large and small size prototypes of organic electroluminescent display devices constantly appear, they have not been mass-produced yet, and resolution thereof is not high due to the accuracy of film-forming equipment.

Therefore, how to manufacture OLED devices with a high resolution is a difficult problem over which people have been worried in the OLED industry. At present, although there are many different pixel designs such as the well known pixel arrangement modes of square, side by side, pentile and stripe. These pixel designs are only limited to the change in the manner in which pixels themselves are arranged, and its resolution has not yet been well improved. Meanwhile, in comparison with the film forming technology related to thin film transistors with high-precision patterning, it is difficult to put high-precision patterning into practice due to the process and equipment limitations in the evaporation and solution processes for manufacturing organic electroluminescent display devices.

SUMMARY OF THE INVENTION

The present invention provides an organic electroluminescent display panel and a display device to solve the problem of low resolution of the existing organic electroluminescent display device and low Mask alignment accuracy in manufacturing process.

The technical solution adopted for solving the technical problem in the present invention is an organic electroluminescent display panel, including a substrate and a plurality of sub-pixel units of the same shape formed on the substrate, wherein each sub-pixel unit includes 6 sub-pixel elements in the same color;

the sub-pixel units are in 3 colors, any two adjacent sub-pixel units being different in color; and 3 sub-pixel elements in 3 colors form one pixel unit.

In the organic electroluminescent display panel of the present invention, the Mask alignment accuracy in the manufacturing process of sub-pixel units can be increased by manufacturing each sub-pixel unit to include 6 sub-pixel elements emitting light in the same color. Meanwhile, since the area of each sub-pixel element is ⅙ that of each sub-pixel unit, the resolution of an organic electroluminescent display panel may be 6 times as high as the prior art.

Preferably, 6 sub-pixel elements included in each sub-pixel unit are arranged successively by taking the center of the sub-pixel unit in which the 6 sub-pixel elements are located as a vertex of a geometric shape thereof; wherein, the connecting lines of the centers of every two adjacent sub-pixel units among 3 sub-pixel units adjacent to each other form an equilateral triangle, and 3 sub-pixel elements defined by the equilateral triangle form one pixel unit.

Preferably, the sub-pixel units comprise a plurality of red sub-pixel units, a plurality of green sub-pixel units and a plurality of blue sub-pixel units.

Further preferably, the organic electroluminescent display panel further includes a plurality of thin film transistors, and the plurality of thin film transistors are electrically connected with the sub-pixel elements in one-to-one correspondence to drive the sub-pixel elements to emit light.

Still further preferably, the organic electroluminescent display panel further includes a source drive circuit, a gate drive circuit, and a plurality of gate lines and a plurality of data lines provided to be intersected with each other and insulated from each other, and each sub-pixel element is provided at an intersection point of a corresponding gate line and a corresponding data line; the gate drive circuit is electrically connected with the gate lines to input gate drive signals to the gate lines; the source drive circuit is electrically connected with the data lines to input source drive signals to the data lines; wherein, the gate lines and the data lines respectively corresponding to 6 sub-pixel elements of the same sub-pixel unit are provided in different film layers.

Preferably, the shape of each sub-pixel unit is any one of a regular hexagon, a regular dodecagon, and a circle.

Preferably, the sub-pixel element is a top emitting type element or a bottom emitting type element.

The technical solution adopted for solving the technical problem in the present invention is a display device including the aforesaid organic electroluminescent display panel.

Since the display device according to the present invention includes the aforesaid organic electroluminescent display panel, the resolution thereof is higher.

DETAILED DESCRIPTION OF THE EMBODIMENTS

To make the person skilled in the art better understand the technical solution of the present invention, the present invention is further described below in details in conjunction with the accompanying drawings and the specific embodiments.

Figure 1:
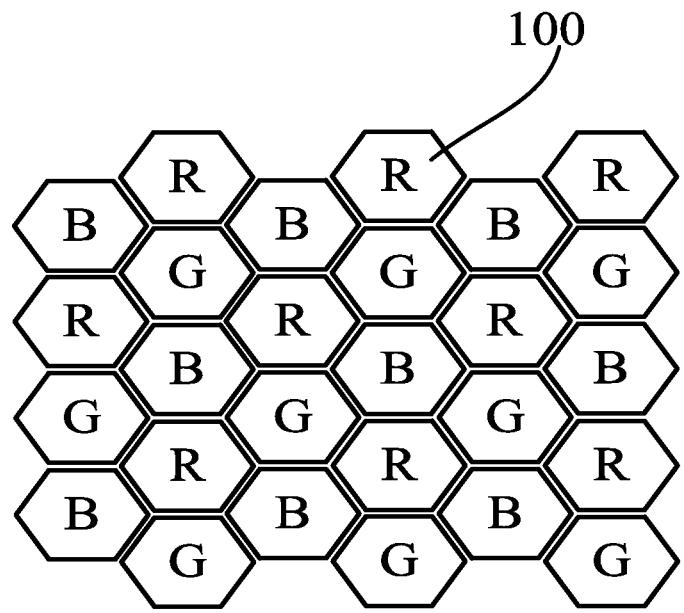
FIG. 1 is a plan schematic diagram of an organic electroluminescent display panel in the embodiments of the present invention.
Figure 2:
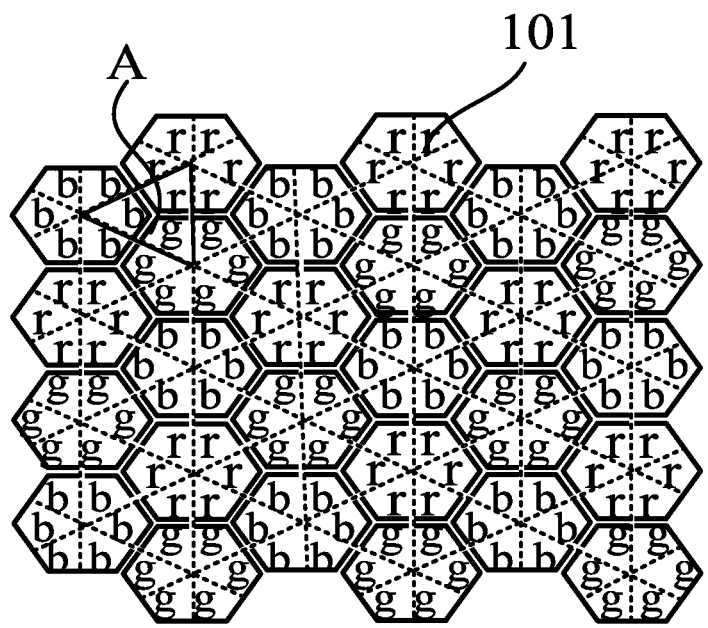
FIG. 2 is a specific plan schematic diagram of an organic electroluminescent display panel in the embodiments of the present invention.

According to the present invention, provided is an organic electroluminescent display panel. As shown in FIGS. 1 and 2, an organic electroluminescent display panel according to one embodiment of the present invention includes a substrate 1 (see FIG. 3) and a plurality of sub-pixel units 100 of the same shape and different colors which are formed on the substrate 1, wherein each sub-pixel unit 100 includes 6 sub-pixel elements 101 in the same color; the sub-pixel units 100 are in 3 colors, any two adjacent sub-pixel units 100 being different in color; and 3 sub-pixel elements 101 in 3 colors form one pixel unit.

In the organic electroluminescent display panel according to this embodiment, the Mask alignment accuracy in the manufacturing process of the sub-pixel unit 100 can be increased by manufacturing each sub-pixel unit 100 to include a plurality of sub-pixel elements 101 emitting light in the same color. Any two adjacent sub-pixel units 100 emit light in different colors, and 3 sub-pixel elements 101 defined by the connecting lines of the centers of every two adjacent sub-pixel units among 3 sub-pixel units adjacent to each other form one pixel unit A, namely form one display unit of a pixel region of a display panel for full-color display. Meanwhile, the area of the pixel unit A in the embodiment of the present invention is ⅙ that of the traditional organic electroluminescent display panel, so that the resolution of an organic electroluminescent display panel may be greatly enhanced to be 6 times as high as the original.

In order to make the display of the display panel more uniform, namely make the pixel units A be the same in shape and size, preferably, each sub-pixel unit 100 includes 6 sub-pixel elements 101 of the same shape and color, and these 6 sub-pixel elements 101 are arranged successively by taking the center of the sub-pixel unit 100 as the vertex of the geometric shape thereof. In other words, the 6 sub-pixel elements 101 are obtained by equally dividing each sub-pixel unit 100 into six parts, and the vertexes of the geometric shapes of the obtained 6 sub-pixel elements are located in the center of the sub-pixel unit 100; the sub-pixel units 100 are in 3 colors, any two adjacent sub-pixel units 100 being different in color; and the connecting lines of the centers of every two adjacent sub-pixel units among 3 sub-pixel units adjacent to each other form an equilateral triangle, 3 sub-pixel elements 101 defined by the equilateral triangle forming one pixel unit A.

Preferably, the plurality of sub-pixel units 100 in 3 colors in the organic electroluminescent display panel according to this embodiment includes: a plurality of red sub-pixel units, a plurality of green sub-pixel units and a plurality of blue sub-pixel units; each red sub-pixel unit includes 6 red sub-pixel elements, each green sub-pixel unit includes 6 green sub-pixel elements, and each blue sub-pixel unit includes 6 blue sub-pixel elements. Therefore, the full-color, low-power-consumption and high-resolution display can be put into practice.

Specifically, sub-pixel elements 101 of each sub-pixel unit 100 may be organic light-emitting diode elements of small molecule material, or organic light-emitting diode elements of polymer material.

In this embodiment, the shape of each sub-pixel unit 100 shown in FIGS. 1 and 2 is a regular hexagon, but the present invention is not limited thereto; the shape of the sub-pixel unit 100 may also be a regular dodecagon or a circle, and certainly be other shape approximate to a circle.

Preferably, the organic electroluminescent display panel according to this embodiment may further include a plurality of thin film transistors, which are electrically connected with the sub-pixel elements 101 in one-to-one correspondence to drive the sub-pixel elements to emit light. Specifically, a source of the thin film transistor is electrically connected with a first electrode (generally an anode) of the sub-pixel element.

Figure 3:
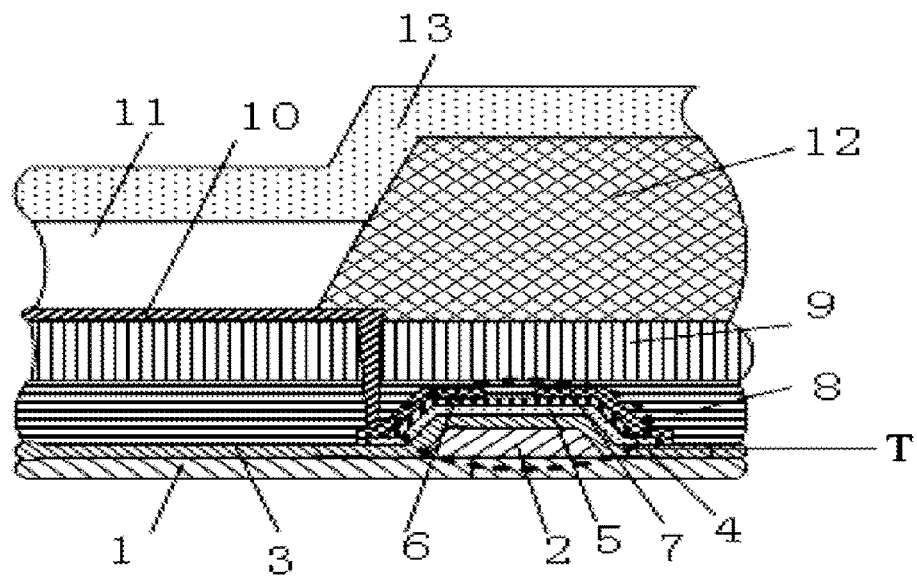
FIG. 3 is a cross-sectional schematic diagram of a structure of an organic electroluminescent element formed above a thin film transistor in the embodiments of the present invention.

As shown in FIG. 3, the process for forming an organic electroluminescent display panel driven in an active matrix mode will be specifically illustrated below by taking the process for forming a red (R) sub-pixel element and a corresponding thin film transistor T as an example:

Step a, the thin film transistor T is formed on a substrate 1.

This step a specifically includes a step of forming a gate 2, a gate insulation layer 3, an active layer 4, a source 7 and a drain 6. The specific process for forming a bottom gate type thin film transistor includes following steps: first forming a gate metal layer on the substrate 1, patterning the gate metal layer (including such technical processes as the coating, exposing and developing of a photoresist, etching, the stripping of the photoresist and the like, the patterning processes described below all including the aforesaid technical processes unless otherwise stated) to form a pattern of the gate 2; then forming the gate insulation layer 3 above the gate 2; then forming a semiconductor layer above the gate insulation layer 3, patterning the semiconductor layer to form the active layer 4; and finally forming a source-drain metal layer above the active layer 4, and patterning the source-drain metal layer to form patterns of the source 7 and the drain 6. Before the step of forming the source-drain metal layer above the active layer 4, an etching stop layer 5 may also be formed above the active layer to prevent the patterning process for forming the source 7 and the drain 6 from affecting the active layer 4.

It is to be noted that, the thin film transistor in this embodiment is not limited to the bottom gate type, and instead may be of a top gate type or coplanar type.

Step b, a passivation layer 8 and a planarization layer 9 are formed successively above the thin film transistor and are then patterned to form a via hole, and a plurality of grooves are formed on the surface of planarization layer 9.

The planarization layer 9 may be formed specifically through such film forming processes as PECVD (Plasma Enhanced Chemical Vapor Deposition), spin coating, sputtering, ink jet printing and the like. A photoresist is coated on the planarization layer 9, and exposed by using a half-tone or grey-tone mask plate to form a photoresist fully-reserved area, a photoresist partly-reserved area and a photoresist non-reserved area. The photoresist fully-reserved area at least corresponds to the area where the plurality of grooves are located, the photoresist partly-reserved area at least corresponds to the area where the via hole is located, and the photoresist non-reserved area corresponds to other areas. The planarization layer 9 and the passivation layer 8 of the photoresist partly-reserved area are etched away by a first etching process to form the required via hole, and the remained photoresist is stripped. Parts of the planarization layer 9 of the photoresist fully-reserved area are etched away by a second etching process to form the plurality of grooves. The plurality of grooves correspond to the area where the first electrode 10 is located. With the aforesaid steps, the surface of the display panel may be still planar after the first electrode 10 is subsequently formed, thus it is convenient to form the sub-pixel element 101 (formed by an organic electroluminescent material layer).

Organic resin or inorganic material, which is good in film forming property, high in insulation property, and similar to material of the first electrode 10 in surface energy, is selected as material of the planarization layer 9. In addition, material of the planarization layer 9 can resist UV, Plasma, $O_3$ and other common cleaning processes in the cleaning process before the film forming process of an organic electroluminescent element. Preferably, $SiO_2$, ceramics, organic silicon resin, polyimide or the like is selected as material of the planarization layer 9.

Step c, the organic electroluminescent element is formed on the planarization layer 9.

The organic electroluminescent element includes a first electrode 10 (usually known as anode), a second electrode 13 (usually known as cathode) and an organic electroluminescent material layer 12 sandwiched between the first electrode 10 and the second electrode 13.

Since the organic electroluminescent display device is divided in two classes, namely the top emitting type and the bottom emitting type, an anode with transparency and a cathode with reflectivity are provided for the bottom emitting type display device, whereas an cathode with transparency and an anode with reflectivity are provided for the top emitting type display device. A transparent material or translucent material such as ITO, IZO, Ag, NiO, Al, graphene and the like may be selected for the anode with transparency.

The step c specifically includes:

First, the first electrode 10 is formed in the grooves of the planarization layer 9. Specifically, a conducting layer may be formed by a film forming method such as evaporation, sputtering, coating, spin coating and the like, and then patterned to form the pattern of the first electrode 10.

The first electrode 10 corresponds to the red sub-pixel element 101 in position, and is electrically connected with the drain 6 of the thin film transistor T through the via hole formed in step b and separately controlled by the thin film transistor T. The first electrodes 10 to which different sub-pixel elements 101 (including adjacent sub-pixel elements 101 emitting light in the same color, and adjacent sub-pixel elements emitting light in different colors) correspond are insulated from each other. The width of the gap between 6 first electrodes 10 to which each sub-pixel unit corresponds is set as 100 nm-500 μm, preferably in the range of 5 μm-100 μm, for the complete insulation between the first electrodes 10;

Afterwards, a pixel defining layer 11 is formed on the planarization layer 9 to define the area where the sub-pixel unit 100 is located.

For the evaporation process, since 6 sub-pixel elements 101 emitting light in the same color are included in the area of each sub-pixel unit 100, the increase of the area enables the organic electroluminescent material layer subsequently forming each sub-pixel unit 100 to be spread smoothly, thus avoiding the electric leakage risk caused by non-uniform film forming at the edge of a retaining wall. Since the area where the sub-pixel element 101 is located is defined by the pixel defining layer 11, the electric leakage risk caused by non-uniform film forming at the edge of the retaining wall is avoided.

Similarly, for solution process, 6 sub-pixel elements 101 emitting light in the same color are included in the area of each sub-pixel unit 100, and the film forming environment of ink droplets is constant, so the film-forming uniformity thereof will be improved dramatically. Since the pixel defining layer 11 defines the area where the sub-pixel element 101 is located, the decrease of the area will inevitably cause the coffee ring phenomenon at the edge of each sub-pixel element 101, thus seriously affecting the film forming quality.

Afterward, the organic electroluminescent material layer 12 is formed on the first electrode 10. A typical organic electroluminescent material layer includes one or more of a hole injection layer, a hole transport layer, a luminescent layer, a hole barrier layer, an electron barrier layer, an electron transport layer, an electron injection layer and the like. The organic electroluminescent material layer 12 is patterned to form the red sub-pixel element 101 located in the area of the corresponding sub-pixel unit 100.

Afterward, the second electrode 13, usually known as anode, is formed on the red sub-pixel element 101.

The cathode may be a plate electrode covering the whole substrate, so only the voltage applied to the anode has to be changed to control the luminescence of the sub-pixel element, thus simplifying the manufacturing process.

The common cathode material is preferably one or a combination of such metals as Al, Mg, Ca, Ba, Na, Li, K, Ag and the like.

The manufacturing of all red sub-pixel units can be completed simultaneously through the aforesaid steps a-c.

The manufacturing of the green sub-pixel units and the blue sub-pixel units can also be respectively completed through the aforesaid steps. Thus, the sub-pixel units are manufactured in three times.

Certainly, the MASKs in the aforesaid processes for manufacturing the red sub-pixel units, the green sub-pixel units and the blue sub-pixel units can also be used simultaneously to complete the manufacturing of the red sub-pixel units, the green sub-pixel units and the blue sub-pixel units in one time.

Finally, the organic electroluminescent display device has to be packaged to prevent the organic electroluminescent display device layer from being damaged due to moisture and oxygen, common packaging modes including Frit, Dam&Fill, Film, metal, and Laminator and the like.

Figure 4:
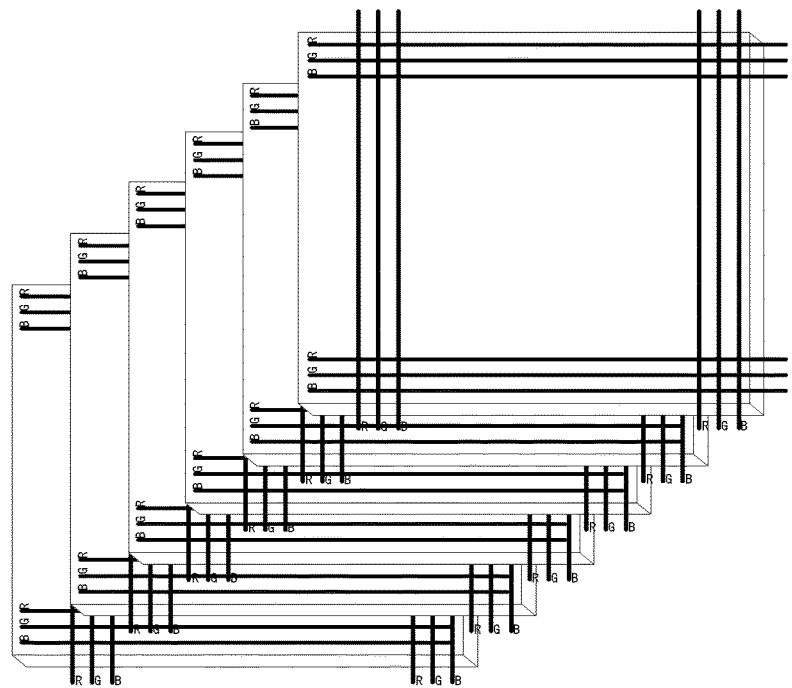
FIG. 4 is a schematic diagram illustrating wiring of a drive circuit of an organic electroluminescent display panel in the embodiments of the present invention.

As shown in FIG. 4, preferably, the organic electroluminescent display panel according to this embodiment further includes a source drive circuit, a gate drive circuit, and a plurality of gate lines and data lines provided in a crosswise and isolated way, and each sub-pixel element is provided where the gate line and the data line corresponding thereto intersect; the gate drive circuit is electrically connected with the gate lines to input gate drive signals to the gate lines; the source drive circuit is electrically connected with the data lines to input source drive signals to the data lines; wherein, the gate lines and data lines corresponding to 6 sub-pixel elements 101 of the same sub-pixel unit 100 are provided in different film layers. Provided as above, it is possible to solve the problem that it is difficult to drive 6 sub-pixel elements 101 in each pixel unit 100 repeatedly by using the conventional source drive circuit and gate drive circuit.

According to the present invention, a display device is further provided, including the organic electroluminescent display panel of the present invention described above. The display device may be products or components with display function, such as a mobile phone, a tablet computer, a television, a display, a laptop, a digital photo frame, a navigator, a variety of touch devices and the like.

Since the display device of the present invention includes the aforesaid display panel, the resolution thereof has been improved distinctively.

Certainly, the display device of the present invention may further include other conventional structures such as a power supply unit, a display drive unit and the like, for which unnecessary details are no longer given herein.

It should be understood that the above embodiments are only exemplary embodiments for illustrating the principle of the present invention, but the present invention is not limited thereto. Various variations and modifications can be made by those of ordinary skill in the art without departing from the spirit and essence of the present invention, and these variations and modifications should also be considered to be within the protection scope of the present invention.

The invention claimed is:

1. An organic electroluminescent display panel, comprising a substrate and a plurality of sub-pixel units of the same shape formed on the substrate, wherein
each sub-pixel unit comprises 6 sub-pixel elements in the same color;
the sub-pixel units are in 3 colors, any two adjacent sub-pixel units being different in color; and
3 sub-pixel elements in the 3 colors form one pixel unit.

2. The organic electroluminescent display panel according to claim 1, wherein
6 sub-pixel elements included in each sub-pixel unit are arranged successively by taking the center of the sub-pixel unit in which the 6 sub-pixel elements are located as a vertex of a geometric shape thereof; and
the connecting lines of the centers of every two adjacent sub-pixel units among 3 sub-pixel units adjacent to each other form an equilateral triangle, and 3 sub-pixel elements defined by the equilateral triangle form one pixel unit.

3. The organic electroluminescent display panel according to claim 2, wherein the sub-pixel units comprise a plurality of red sub-pixel units, a plurality of green sub-pixel units and a plurality of blue sub-pixel units.

4. The organic electroluminescent display panel according to claim 3, wherein the organic electroluminescent display panel further comprises a plurality of thin film transistors, and the plurality of thin film transistors are electrically connected with the sub-pixel elements in one-to-one correspondence to drive the sub-pixel elements to emit light.

5. The organic electroluminescent display panel according to claim 4, wherein the organic electroluminescent display panel further comprises a source drive circuit, a gate drive circuit, and a plurality of gate lines and a plurality of data lines provided to be intersected with each other and insulated from each other, and each sub-pixel element is provided at an intersection point of a corresponding gate line and a corresponding data line; the gate drive circuit is electrically connected with the gate lines to input gate drive signals to the gate lines; the source drive circuit is electrically connected with the data lines to input source drive signals to the data lines; and
the gate lines and the data lines respectively corresponding to 6 sub-pixel elements of the same sub-pixel unit are provided in different film layers.

6. The organic electroluminescent display panel according to claim 3, wherein the shape of each sub-pixel unit is any one of a regular hexagon, a regular dodecagon, and a circle.

7. The organic electroluminescent display panel according to claim 3, wherein the sub-pixel element is a top emitting type element or a bottom emitting type element.

8. The organic electroluminescent display panel according to claim 2, wherein the shape of each sub-pixel unit is any one of a regular hexagon, a regular dodecagon, and a circle.

9. The organic electroluminescent display panel according to claim 2, wherein the sub-pixel element is a top emitting type element or a bottom emitting type element.

10. The organic electroluminescent display panel according to claim 1, wherein the sub-pixel units comprise a plurality of red sub-pixel units, a plurality of green sub-pixel units and a plurality of blue sub-pixel units.

11. The organic electroluminescent display panel according to claim 10, wherein the organic electroluminescent display panel further comprises a plurality of thin film transistors, and the plurality of thin film transistors are electrically connected with the sub-pixel elements in one-to-one correspondence to drive the sub-pixel elements to emit light.

12. The organic electroluminescent display panel according to claim 11, wherein the organic electroluminescent display panel further comprises a source drive circuit, a gate drive circuit, and a plurality of gate lines and a plurality of data lines provided to be intersected with each other and insulated from each other, and each sub-pixel element is provided at an intersection point of a corresponding gate line and a corresponding data line; the gate drive circuit is electrically connected with the gate lines to input gate drive signals to the gate lines; the source drive circuit is electrically connected with the data lines to input source drive signals to the data lines; and
the gate lines and the data lines respectively corresponding to 6 sub-pixel elements of the same sub-pixel unit are provided in different film layers.

13. The organic electroluminescent display panel according to claim 10, wherein the shape of each sub-pixel unit is any one of a regular hexagon, a regular dodecagon, and a circle.

14. The organic electroluminescent display panel according to claim 11, wherein the shape of each sub-pixel unit is any one of a regular hexagon, a regular dodecagon, and a circle.

15. The organic electroluminescent display panel according to claim 10, wherein the sub-pixel element is a top emitting type element or a bottom emitting type element.

16. The organic electroluminescent display panel according to claim 11, wherein the sub-pixel element is a top emitting type element or a bottom emitting type element.

17. The organic electroluminescent display panel according to claim 1, wherein the shape of each sub-pixel unit is any one of a regular hexagon, a regular dodecagon, and a circle.

18. The organic electroluminescent display panel according to claim 1, wherein the sub-pixel element is a top emitting type element or a bottom emitting type element.

19. A display device, comprising an organic electroluminescent display panel, which comprises a substrate and a plurality of sub-pixel units of the same shape formed on the substrate, wherein each sub-pixel unit comprises 6 sub-pixel elements in the same color;

the sub-pixel units are in 3 colors, any two adjacent sub-pixel units being different in color; and 3 sub-pixel elements in the 3 colors form one pixel unit.

20. The display device according to claim 19, wherein 6 sub-pixel elements included in each sub-pixel unit are arranged successively by taking the center of the sub-pixel unit in which the 6 sub-pixel elements are located as a vertex of a geometric shape thereof; and the connecting lines of the centers of every two adjacent sub-pixel units among 3 sub-pixel units adjacent to each other form an equilateral triangle, and 3 sub-pixel elements defined by the equilateral triangle form one pixel unit.

* * * * *